United States Patent [19]

Adwalpalker et al.

[11] Patent Number: 4,601,424
[45] Date of Patent: Jul. 22, 1986

[54] STRIPPED GOLD PLATING PROCESS

[75] Inventors: Avinash S. Adwalpalker, Stormville; Joseph M. Harvilchuck, Billings; Joseph R. Ranalli, Fishkill; David W. Rich, Middletown, all of N.Y.

[73] Assignee: International Business Machines Corporation, Armonk, N.Y.

[21] Appl. No.: 735,040

[22] Filed: May 17, 1985

[51] Int. Cl.⁴ .............................................. B23K 31/02
[52] U.S. Cl. ....................................... 228/124; 427/96
[58] Field of Search ............... 228/124, 208, 209, 179, 228/263.12, 191; 427/96

[56] References Cited

U.S. PATENT DOCUMENTS

| | | | |
|---|---|---|---|
| 3,362,851 | 1/1968 | Dunster | 117/212 |
| 3,539,390 | 11/1970 | Widmann et al. | 117/213 |
| 3,982,908 | 9/1976 | Arnold | 29/195 |
| 4,268,584 | 5/1981 | Ahn et al. | 428/620 |
| 4,268,849 | 5/1981 | Gray et al. | 357/71 |
| 4,464,420 | 8/1984 | Taguchi et al. | 427/96 |

OTHER PUBLICATIONS

IBM Technical Disclosure Bulletin, vol. 20, No. 9, Feb. 1978, pp. 3443–3444, "Selectively Electroplating Pad Terminals on an MLC Substrate" by M. M. Haddad.
IBM Technical Disclosure Bulletin, vol. 14, No. 4, Sep. 1971, p. 1099, "Nickel/Gold Diffusion Barrier" by J. R. Lynch.
IBM Technical Disclosure Bulletin, vol. 19, No. 12, May 1977, p. 4581, "Process for Preventing Chip Pad Corrosion" by M. M. Haddad et al.

Primary Examiner—Nicholas P. Godici
Assistant Examiner—G. M. Reid
Attorney, Agent, or Firm—Robert J. Haase

[57] ABSTRACT

A method for fabricating metallurgical contacts is disclosed for making thermocompression bonds to a metallized ceramic substrate on which semiconductor chips are to be mounted and electrically contacted. The method comprises placing a nickel layer on the metallized portion of the substrate and then covering the nickel with an immersion layer of gold. The gold immersion layer is selectively removed from locations where thermocompression-bonded contacts are desired. Removal is accomplished by applying a chemical stripper. Heavy gold is electroplated on said locations and the assemblage is heat treated prior to placement of the thermocompression-bonded contacts.

8 Claims, 1 Drawing Figure

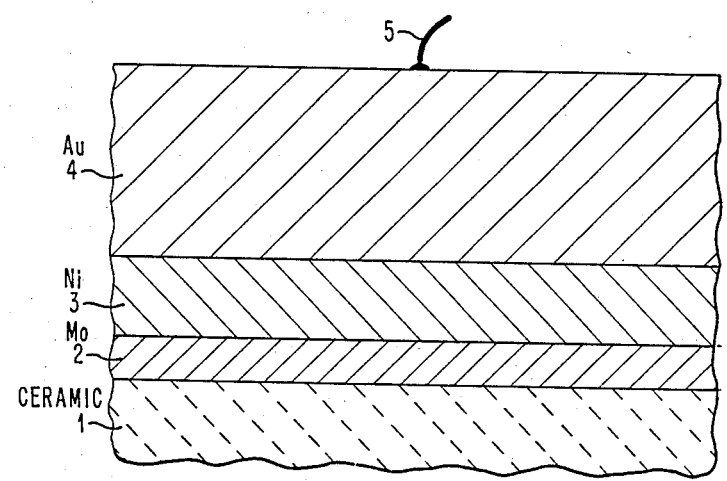

STRIPPED GOLD PLATING PROCESS

BACKGROUND OF INVENTION

1. Field of Invention

The present invention generally relates to nickel-gold plating processes for semiconductor and insulating substrates, and, more particularly, to such a process characterized by significantly enhanced bond strength between the gold and the nickel.

2. Description of the Prior Art

In the metallization of ceramic and other substrates for the purpose of providing electrical contact terminals, nickel is often deposited as a base layer. Nickel, however, is known to oxidize rather readily and the resulting oxide interferes with the establishment of sound electrical contact. Accordingly, steps have been taken in the prior art to inhibit or prevent the oxidation of nickel by the application of a material, usually gold, over the nickel as soon as the nickel layer has been formed. In some instances where a thick layer of gold is desired, such as where thermocompression bonding is required, a thick layer of gold is electroplated on the nickel. This is disclosed in the IBM ® Technical Disclosure Bulletin "Process For Preventing Chip Pad Corrosion" by M. M. Haddad et al, Vol. 19, No. 12, May 1977, page 4581. A similar thick gold electroplating process is described in the Technical Disclosure Bulletin "Selectively Electroplating Pad Terminals on an MLC Substrate" by M. M. Haddad, Vol. 20, No. 9, February 1978, page 3443.

In the Technical Disclosure Bulletin "Nickel/Gold Diffusion Barrier" by J. R. Lynch, Vol. 14, No. 4, September 1971, page 1099, a diffusion barrier is formed between a layer of electroplated gold and an adjacent layer of nickel in order to prevent the diffusion of the nickel into a silicon device which is to be bonded to the gold layer. The diffusion barrier is formed by a layer of electroplated gold placed on the nickel and then fired in a hydrogen atmosphere at about 700° C. The barrier layer is left in place and later covered by an additional layer of gold to which the silicon device is bonded.

It has been found that the process of the above-cited 1971 Technical Disclosure Bulletin also is suitable for use in applications where thermocompression bonding is desired and where a diffusion barrier, as such, is not needed. More recently, however, it has been noted that the "pull strength" of a thermocompression bond established upon a metallurgical combination of a second gold layer upon a first gold layer (diffusion barrier), upon a nickel layer, upon a substrate, is insufficient. In some cases, it is necessary that the pull strength be increased by a factor of 50% or more.

SUMMARY OF THE INVENTION

The pull strength of a metallurgical system comprising a bottom layer of nickel and a top layer of heavy gold is increased by application of a thin immersion layer of gold on the nickel layer and the specific stripping of the undiffused immersion gold by a chemical etchant before the top layer of heavy gold is placed down. According to another feature of the invention, the final structure of nickel and heavy gold is subjected to a 550° C. anneal which softens the heavy gold deposit and diffuses the gold into the nickel and improves the pull strength or bondability of the assemblage.

BRIEF DESCRIPTION OF THE DRAWING

The sole FIGURE is a simplified cross-sectional view of a metallurgical system, in accordance with the present invention for making electrical contact to metallized ceramic substrate.

BEST MODE FOR CARRYING OUT THE INVENTION

Ceramic substrate 1 is metallized by a layer 2 of, for example, molybdenum which is personalized or shaped by conventional lithography techniques into a pattern of desired electrical contact areas (not shown), as is well understood in the semiconductor chip packaging art. A nickel layer 3 typically is placed over the molybdenum contact area in preparation for a thick or heavy gold deposit 4 which is required for thermocompression bonding of a wire 5, as generally described in the aforementioned February 1978 Technical Disclosure Bulletin.

It is known that nickel quickly becomes oxidized causing its surface to become passive to subsequent plating. Such oxidation may be inhibited by the application of a "flash" coating of a different metal, for example gold, according to the teaching of U.S. Pat. No. 3,362,851 to D. Dunster, issued on Jan. 9, 1968. However, while a flash coating of gold acts as an oxidation inhibiter, it has been found that the pull strength of the bond between the heavy or thick gold and the nickel is limited unnecessarily when an intervening flash coating of gold is left intact and completely diffused into the final composite structure.

In accordance with the present invention, an immersion gold layer of about 700 Å to about 1200 Å thickness is placed upon the nickel without any further step to enhance the diffusion of the gold into the nickel. Selective masking is applied to cover those nickel areas which are not to receive any thermocompression bonding. Then, the undiffused immersion gold is removed from the unmasked areas by a chemical stripper immediately before the heavy gold is electroplated upon the unmasked nickel. It is preferred to use a chemical stripper for removing the immersion gold characterized by the following constituents and approximate concentrations:

1. gold complexing agent such as potassium cyanide-16%;
2. oxidizing agent such as sodium meta-nitro benzoate-49%;
3. sodium carbonate (to make a solution PH of about 11.5-26%;
4. sodium sulfate-9%;
5. lead ion-0.05%;
6. water.

Finally, the selective masking is removed and the heavy gold is diffused into the nickel with preferably a 550° C. heat treatment cycle to produce a metallurgical system characterized by reduced hardness and enhanced pull strength relative to that attainable using the prior art processes cited.

The following detailed example (which contrasts the process steps of a prior process similar to the above-cited 1971 Technical Disclosure Bulletin with those of the present invention) will facilitate a more complete understanding of the present invention.

| PROCESS |
| --- |

| PRIOR PROCESS | STEPS | PRESENT INVENTION |
| --- | --- | --- |
| NiB electroless plate | (1) | NiB electroless plate |
| 24 hour bake | (2) | 24 hour bake |
| Ni diffusion | (3) | Ni diffusion |
| Plasma ash | (4) | Plasma ash |
| Immersion Au Deposition | (5) | Immersion gold deposition (thin gold) |
| Au Diffusion 550° C. | (6) | Heavy gold screening preclean |
| Heavy Au screen preclean | (7) | Heavy gold screening |
| Heavy Au screen | (8) | Hot water soak |
| Hot water soak | (9) | Air dry |
| Air dry | (10) | Chemical etching of thin gold 15-60 Gm/liter, 120 sec. - 10 sec. |
| Au strike | (11) | Rinse |
| Heavy Au plate | (12) | Gold strike |
| Vapor degrease | (13) | Heavy gold plate |
| Post clean | (14) | Vapor degrease |
| End | (15) | Post clean |
|  | (16) | Heavy gold diffusion 550° C. - 105 min. |
|  | (17) | Plasma ash End |

| CHEMICAL STRIPPER CONCENTRATION | TIME REQUIRED TO REMOVE IMMERSION AU |
| --- | --- |
| Gm/Liter |  |
| 15 | 60-120 sec. |
| 30 | 45-75 sec. |
| 40 | 30-50 sec. |
| 50 | 20-40 sec. |
| 60 | 10-20 sec. |

It will be noted that the first 5 steps of the present invention are the same as those of the prior process. However, the gold diffusion step 6 of the prior process is omitted in the present invention and replaced by the later-occurring heavy gold diffusion step 16. Steps 6-9 of the present invention are similar to steps 7-10 of the prior process.

The undiffused thin gold layer resulting from step 5 is etched away in step 10 of the present invention and rinsed (step 11). Then the remaining steps 11-14 of the prior process are used as steps 12-15 of the present invention. Finally, the postponed gold diffusion step is exercised in step 16 and is followed by a plasma ash to form a Au-Ni diffusion barrier necessary to assure proper metallurgy and subsequent bondability in the use of the present invention.

The following average bond pull strength results were obtained in a comparison test between 3105 control samples made with the prior process and 423 samples made with the present invention, using the steps described above:

| PRIOR PROCESS | PRESENT INVENTION |
| --- | --- |
| 68 ± 2 grams | 85 ± 0 grams |

In addition, it was found that non-repairable failures (such as delamination at the metallurgical interfaces) were eliminated while repairable failures (such as rupturing of the gold bulk) were reduced in specimens constructed with the method of the present invention relative to specimens constructed with the prior process.

While the invention has been illustrated and described with reference to preferred embodiments thereof, it is to be understood that the invention is not limited to the precise construction herein disclosed and the right is reserved to all changes and modifications coming within the scope of the invention as defined in the appended claims.

We claim:
1. The process comprising
depositing nickel on a substrate,
forming a thin layer of gold over said nickel,
chemically stripping said gold layer,
depositing thick gold over said nickel, and
diffusing said thick gold into said nickel.
2. The process defined in claim 1 wherein said thick gold diffusing step is done at a temperature of about 550° C.
3. The process as described in claim 1 wherein said substrate is a ceramic material.
4. The process as described in claim 3 and further including a heating step for diffusing said nickel into said substrate.
5. The process as described in claim 1 wherein said thin layer of gold is formed by an immersion process to a thickness in the range of about 700 Å to about 1200 Å.
6. The process as described in claim 1 and further including the step of thermocompression bonding an electrode to said thick gold.
7. The process comprising
depositing nickel on a substrate,
forming a thin layer of gold over said nickel,
selectively placing a masking material to cover certain areas of said nickel,
chemically stripping said gold layer from said unmasked areas,
depositing thick gold over said unmasked areas of said nickel,
removing said masking material,
diffusing said thick gold into said nickel, and
thermocompression bonding an electrode to said thick gold.
8. The process as described in claim 7 wherein said thick gold diffusing step is done at a temperature of about 550° C.

* * * * *